(12) United States Patent
Hansel et al.

(10) Patent No.: US 9,266,689 B2
(45) Date of Patent: Feb. 23, 2016

(54) PICK AND BOND METHOD FOR ATTACHMENT OF ADHESIVE ELEMENT TO SUBSTRATE

(75) Inventors: Mathias Hansel, Rummingen (DE); Frederic Laure, Gomez la Ville (FR); Olivier Daverio, Folgensburg (FR)

(73) Assignee: A. Raymond Et Cie, Grenoble (FR)

( * ) Notice: Subject to any disclaimer, the term of this patent is extended or adjusted under 35 U.S.C. 154(b) by 0 days.

(21) Appl. No.: 13/695,896

(22) PCT Filed: May 3, 2011

(86) PCT No.: PCT/IB2011/001384
§ 371 (c)(1),
(2), (4) Date: Jan. 17, 2013

(87) PCT Pub. No.: WO2011/161514
PCT Pub. Date: Dec. 29, 2011

(65) Prior Publication Data
US 2013/0112351 A1 May 9, 2013

Related U.S. Application Data

(60) Provisional application No. 61/330,577, filed on May 3, 2010.

(51) Int. Cl.
*B29C 65/02* (2006.01)
*B65G 65/40* (2006.01)
*F16B 11/00* (2006.01)
*H01L 21/48* (2006.01)
*B29C 65/54* (2006.01)

(52) U.S. Cl.
CPC .............. *B65G 65/40* (2013.01); *B29C 65/02* (2013.01); *B29C 65/544* (2013.01); *F16B 11/006* (2013.01); *H01L 21/486* (2013.01); *Y10T 156/17* (2015.01)

(58) Field of Classification Search
CPC ........................................................ B29C 65/02
USPC ........................................................ 156/309.9
See application file for complete search history.

(56) References Cited

U.S. PATENT DOCUMENTS

2002/0135066 A1 * 9/2002 Corisis et al. ................. 257/738

FOREIGN PATENT DOCUMENTS

| JP | 09213742 A | * | 8/1997 |
| JP | 10079404 A | * | 3/1998 |

* cited by examiner

*Primary Examiner* — Daniel Lee
(74) *Attorney, Agent, or Firm* — LeClairRyan

(57) ABSTRACT

A method for the attachment of a formed adhesive element (34,34') to a hot bonding part (10) in a practical and efficient way is disclosed. The formed adhesive element may be attached to the hot bonding part by the end-user prior to attachment of the hot bonding part to the substrate. In order to attach the formed adhesive element (34,34') to the bonding part according to the disclosed invention, the bonding part (10) is heated then is moved in position over the formed adhesive element positioned on a detent of a matrix plate (36). Thereafter the hot bonding part is moved into contact with the formed adhesive element or the formed adhesive element is moved against the hot bonding part. The bonding part, now having the formed adhesive element attached, is ready for attachment to the substrate. One or more formed adhesive elements may be attached to the bonding part. Attachment of the formed adhesive elements to the bonding part may be done manually or mechanically.

11 Claims, 6 Drawing Sheets

PICK AND BOND METHOD FOR ATTACHMENT OF ADHESIVE ELEMENT TO SUBSTRATE

TECHNICAL FIELD

The disclosed invention relates to a bonding part attachable to a glass surface or other substrate through the use of adhesives. More particularly, the disclosed invention relates a method for attaching a prepared adhesive, such as a structural polyurethane, epoxy or other basic formed adhesive, pressed from a powder to an adhesive tablet, to a bonding part made of any one of several materials including, metal, glass, ceramics, plastics, wood and composites for attachment to another component such as a glass surface or to another substrate made of materials such metal, ceramics, plastics, wood and composites.

BACKGROUND OF THE INVENTION

Attachment of a first component to a second component for any of a variety of applications may be made by any of several known methods of fastening, including mechanical or chemical fastening. Mechanical fastening, while often practical and reliable, is not always usable for every application. For example, where a first component is being attached to a second component and it is not desirable or practical to drill into or otherwise modify the second component for mechanical attachment, chemical fastening is the only other alternative. This is the case where, for example, a component is to be attached to a glass surface or other substrate (the second component). An example of a component-to-glass arrangement may be seen in the automotive industry where a rear view mirror or a metal hinge needs to be attached to a glass surface. Other examples of component-to-glass attachment needs exist such as in home and office construction.

A solution to the bonding challenge was introduced in the form of an adhesive applied between the part to be attached (the bonding part) and the substrate to which the bonding part was attached. These adhesives have been applied in several ways.

According to one known approach, the adhesive is applied to the bonding part by dosing with nozzles and spraying the adhesive onto the bonding part. While this process can be easy and often inexpensive, it suffers from the need to frequently clean the nozzles in order to maintain a desired level of consistency in the actual spraying from part to part. In addition, the sprayed adhesive tends to be sticky, thus resulting in the possibility that the bonding part will come into contact with another object between the time of the spraying of the adhesive and the actual attachment of the bonding part to the substrate.

According to another known approach, a double-sided tape is applied to the bonding part. According to this approach, a release layer is removed from one side of the tape and the tape is applied to the bonding part. The release layer on the other side of the tape is left in place until the bonding part is ready for attachment to the substrate. This approach offers advantages in that it is usable at room temperature and the adhesive for contact with the substrate is not exposed until needed. Furthermore, the adhesive does not require an adhesion promoter. However, while the release layer protects against the adhesive from being inadvertently attached to a surface, it also adds an inconvenient step in the process of attachment of the bonding part to the substrate in that the layer must be removed prior to attachment. The release layer may also tear resulting in a portion of the layer being left behind on the adhesive surface and creating the potential for imperfect adhesion of the bonding part to the substrate. The step of attaching the double-sided tape to the bonding part is also complicated by the fact that this arrangement of structural adhesives can only be used for in-line assembly in which the bonding part, the double-sided tape and the substrate pass through a heater such as an autoclave to achieve full bonding performance.

A third and more attractive method is to provide the bonding part with a formed adhesive element such as a tablet already in position prior to shipment of the bonding part to the end-user. This arrangement is attractive as it results in a bonding part that is ready to bond with no requirement that the end user attach the adhesive tablet to the bonding part. However, it may be that the end user wishes to apply the tablet at its facility and according to its own schedule and arrangement. In such a case the concept of a pre-applied adhesive such as the bonding tablet already fitted to the bonding part may not be the optimal choice.

Accordingly, as in so many areas of fastener technology, there is room in the art of bonding parts for an alternate approach to the manufacture of bonding parts.

SUMMARY OF THE INVENTION

The disclosed invention provides a method for the attachment of a formed adhesive element to a bonding part in a practical and efficient way. The formed adhesive element may be conveniently attached to the bonding part by the end-user prior to attachment of the bonding part to the substrate. In order to attach the formed adhesive element to the bonding part according to the disclosed invention, the bonding part is heated then is moved in position over the formed adhesive element. As an alternative arrangement the bonding part may be used without heating at room temperature. The bonding part is then moved into a pre-contact position relative to the formed adhesive element. Thereafter the bonding part is moved into contact with the formed adhesive element, or the adhesive elements are mechanically or manually pushed against the adhesive coating surface of the bonding part. The bonding part, now having the formed adhesive element attached, is ready for attachment to the substrate. One or more formed adhesive elements may be attached to the bonding part.

Other advantages and features of the invention will become apparent when viewed in light of the detailed description of the preferred embodiment when taken in conjunction with the attached drawings and the appended claims.

BRIEF DESCRIPTION OF THE DRAWINGS

For a more complete understanding of this invention, reference should now be made to the embodiments illustrated in greater detail in the accompanying drawings and described below by way of examples of the invention wherein.

DETAILED DESCRIPTION OF THE PREFERRED EMBODIMENT

Figure 1A:
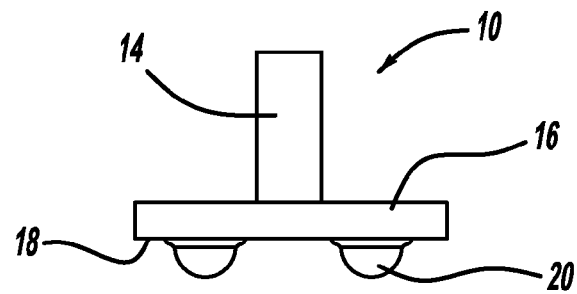
FIG. 1A is an elevational view of a bonding part having formed adhesive elements attached thereto.

In the following figures, the same reference numerals will be used to refer to the same components. In the following description, various operating parameters and components are described for different constructed embodiments. These specific parameters and components are included as examples and are not meant to be limiting.

Figure 2:
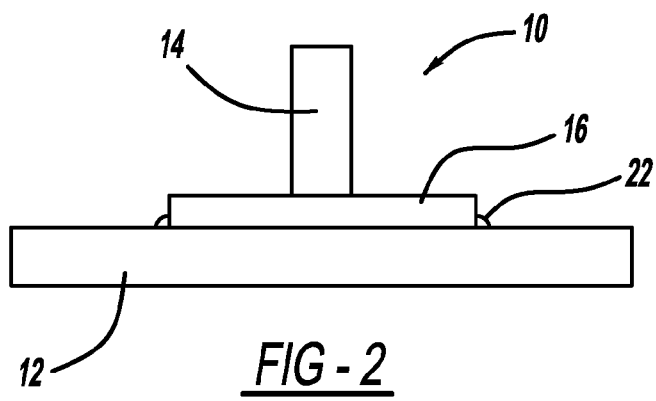
FIG. 2 is a view similar to that of FIG. 1 but illustrating the bonding part attached to a substrate.
Figure 3:
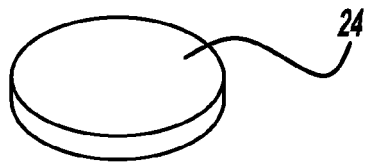
FIG. 3 is a perspective view of a second embodiment of a formed adhesive element.
Figure 4:
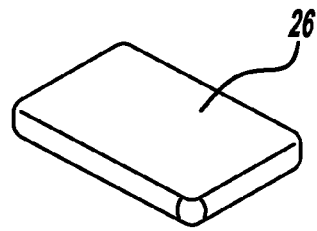
FIG. 4 is a perspective view of a third embodiment of a formed adhesive element.
Figure 5:
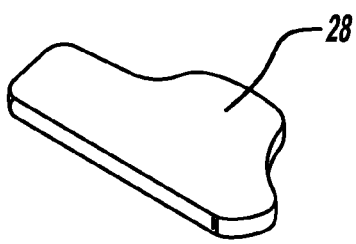
FIG. 5 is a perspective view of a fourth embodiment of a formed adhesive element.
Figure 6:
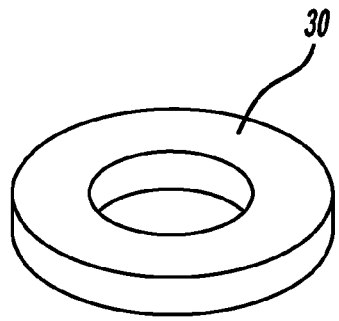
FIG. 6 is a perspective view of a fifth embodiment of a formed adhesive element.
Figure 7:
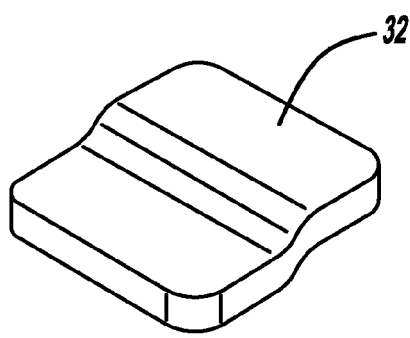
FIG. 7 is a perspective view of a sixth embodiment of a formed adhesive element.

FIGS. 1A and 2 illustrate the general appearance of a bonding part having formed adhesive elements attached thereto. The shape and arrangement of the bonding part is only for illustrative purposes and is not intended as being limiting. In particular, a bonding part, generally illustrated as 10, is shown in position relative to a substrate 12. The substrate 12 may be any of several materials. The bonding part 10 includes a stud element 14 and a bonding plate 16. The bonding plate 16 includes an adhesive-contacting surface 18 upon which one or more formed adhesive elements 20 are attached by adhesion. In FIG. 2, the bonding part 10 is shown adhered to the substrate 12. After attachment of the bonding part 10 to the substrate 12, a portion of the adhesive may overflow the perimeter of the bonding plate 16 in the form of outflow 22.

Figure 1B:
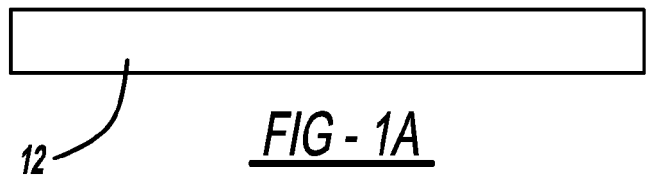
FIG. 1B is a perspective view of a first embodiment of a formed adhesive element having a spherical shape for use in the disclosed invention.
Figure 1B:
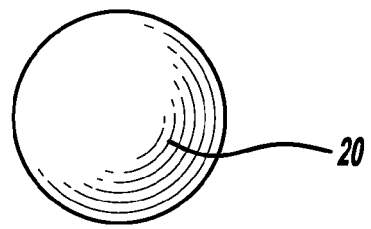

The formed adhesive element 20 may be of any one of a variety of shapes and sizes. This shape may be spherical, as illustrated in FIGS. 1A and 1B, the latter figure showing a conventional shape. However, the illustrated shape and size are only suggestive and it is to be understood that the formed adhesive may be formed and shaped so as to meet any of a variety of needs without limitation. Examples of different shapes and sizes of formed adhesive elements are illustrated in FIGS. 3 through 7. Particularly, and with respect to FIG. 3, a formed adhesive element 24 in the shape of a tablet is illustrated. With respect to FIG. 4, a formed adhesive element 26 in the shape of a wafer is illustrated. With respect to FIG. 5, a formed adhesive element 28 having an irregular shape is illustrated. With respect to FIG. 6, a formed adhesive element 30 in the shape of a ring is illustrated. Finally, with respect to FIG. 7, a formed adhesive element 32 having an irregular shape is illustrated.

The formed adhesive elements may be positioned on apertures of an apparatus (not shown) having a matrix plate and ejector stamps (not shown) either manually or mechanically. Such an apparatus is set forth in co-pending U.S. Ser. No. 13/695,910, incorporated by reference herein. The formed adhesive elements may be moved to the apertures by a transfer head according to the apparatus set forth in co-pending U.S. Ser. No. 12/885,448, incorporated by reference herein.

Placement of the adhesive elements onto the matrix plate and attachment thereof to the bonding part may be made without use of an ejector arrangement as illustrated in FIGS. 8 through 13.

Figure 8:
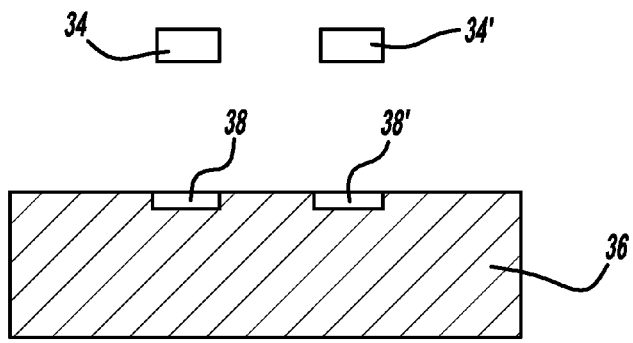
FIG. 8 is a sectional view of an alternate method of fixing the adhesive elements to the bonding part in which the formed adhesive elements are shown before being positioned onto the matrix plate.

With reference to FIG. 8, the pair of formed adhesive elements 34 and 34' are shown above a matrix plate 36. The matrix plate 36 includes a pair of spaced apart, adhesive element-receiving detents 38 and 38' formed therein.

Figure 9:
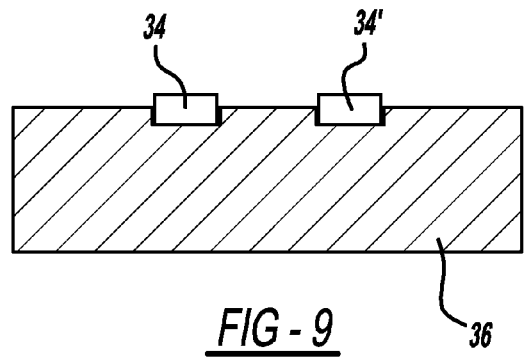
FIG. 9 is a view similar to that of FIG. 8 but showing the formed adhesive elements in place in their respective detents of the matrix plate.

With reference to FIG. 9, a view similar to that of FIG. 8 is shown but the formed adhesive elements 34 and 34' are shown in place in their respective detents 38 and 38' of the matrix plate 36. Placement of the formed adhesive elements 34 and 34' may be made by mechanical placement or manually. As illustrated in FIG. 9, portions of the formed adhesive elements 34 and 34' protrude above the surface of the matrix plate 36.

Figure 10:
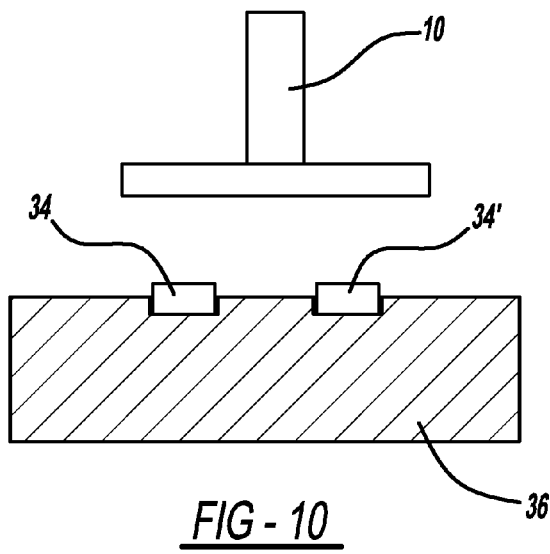
FIG. 10 is a view similar to that of FIG. 9 but showing the bonding part in position above and spaced apart from the formed adhesive elements and the matrix plate.

As shown in FIG. 10, the bonding part 10 has been moved into position above the formed adhesive elements 34 and 34' and the matrix plate 36. As discussed above, the bonding part 10 may be pre-heated or may be unheated and at room temperature.

Figure 11:
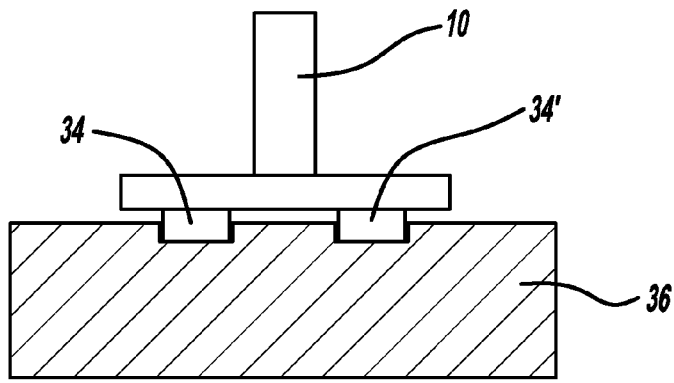
FIG. 11 is a view similar to that of FIG. 10 but showing a bonding part in position on the formed adhesive elements.
Figure 12:
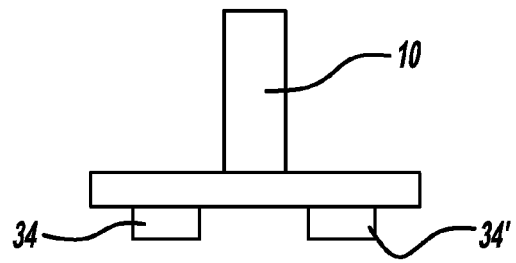
FIG. 12 is a view illustrating the bonding part and its attached formed adhesive elements fitted thereto and positioned over a substrate.
Figure 13:
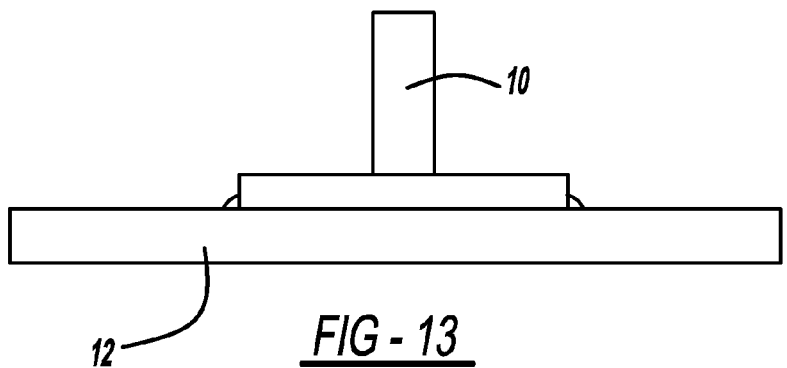
FIG. 13 is a view similar to that of FIG. 12 but illustrating the bonding part adhered to the substrate.

The bonding part 10 is then lowered into contact with the formed adhesive elements 34 and 34' as shown in FIG. 11. Once adhesion is accomplished, the bonding part 10 and its attached formed adhesive elements 34 and 34' are separated from the matrix plate 36 and are positioned over the substrate 12 as shown in FIG. 12. Once in its correct position, the bonding part 10 and its adhesive elements 34 and 34' are attached to the substrate 12 as shown in FIG. 13.

It should be noted that the method and apparatus of the disclosed invention may be used with bonding parts of a great variety of shapes and sizes. The bonding part 10 illustrated and discussed above is only one possible configuration. Another configuration, intended as being illustrative and non-limiting, is shown in FIGS. 14 and 15.

Figure 14:
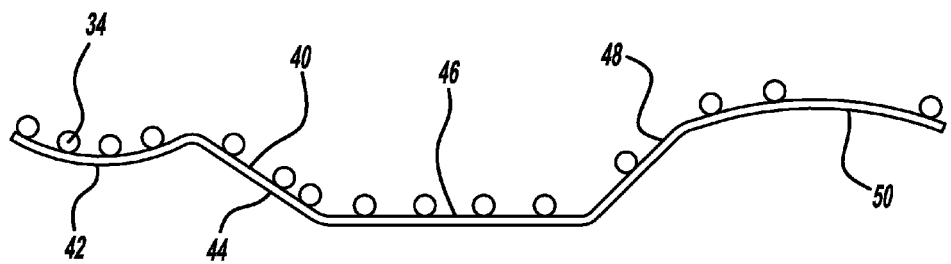
FIG. 14 is a side elevational view of an irregularly-shaped bonding part having a plurality of formed adhesive elements positioned thereon.
Figure 15:
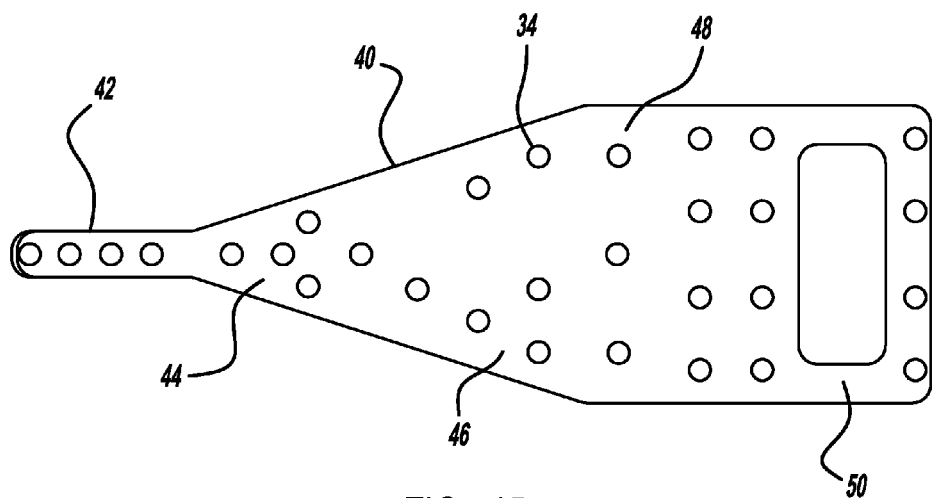
FIG. 15 is a to plan view of the irregularly-shaped bonding part of FIG. 14 illustrating the array of formed adhesive elements positioned thereon.

With respect to FIGS. 14 and 15, a bonding part 40 includes a body having multiple sections of varying shapes and dimensions. Particularly, the bonding part 40 includes a first portion 42 which is generally concave, a second portion 44 which is generally flat having a downward-sloping angle, a third portion 46 which is also generally flat, a fourth portion 48 which is generally flat having an upwardly-sloping angle, and a fifth portion 50 which is generally convex. A plurality of spherical formed adhesive elements 34 are positioned in an array over the first portion 42, the second portion 44, the third portion 46, the fourth portion 48 and the fifth portion 50. As illustrated in FIG. 15, the density of the spherical formed adhesive elements 34 over the various portions may be controlled by the number and placement of the spherical formed adhesive elements 34, thus controlling adhesion so that some portions demonstrate greater adhesion than others.

Figure 16:
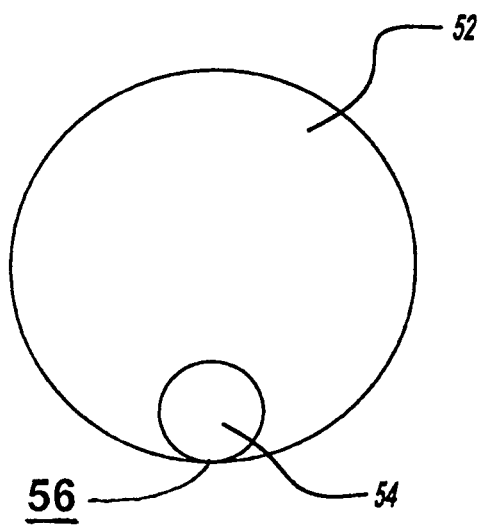
FIG. 16 is a sectional view of a formed adhesive element in the shape of a ball with a spacer element embedded therein.

Not only can the shapes and sizes of the spherical formed adhesive elements be controlled, the composition of the spherical formed adhesive elements can be modified as needed for certain applications. With respect to FIG. 16, a formed adhesive element 52 includes an embedded spacer element 54 which is included within the adhesive element 52 as it is being formed. The spacer element 54 may be composed of a plastic, metal or other material usable with the adhesive elements. The wall of the spacer element 54 and the wall of the adhesive element 52 are associated with one another at a single contact region 56 as illustrated in FIG. 16. Upon attachment of the bonding part to which the formed adhesive element 52 is attached to a substrate, the movement of the bonding part toward the substrate is limited because of the presence of the spacer element 54.

In addition, a color-code system might be employed to distinguish between adhesives. That is, a spherical formed adhesive element having one type of adhesive might include a color that is different than a color of another spherical formed adhesive element, which includes a different type of adhesive.

The foregoing discussion discloses and describes exemplary embodiments of the present invention. One skilled in the art will readily recognize from such discussion, and from the accompanying drawings and claims that various changes, modifications and variations can be made therein without departing from the true spirit and fair scope of the invention as defined by the following claims.

What is claimed is:

1. A method for attaching a formed adhesive element to a bonding part that may be adhered to a substrate comprising the steps of:
    forming a matrix plate having an upper surface and a plurality of formed adhesive element receiving detents formed on said upper surface of said matrix plate;
    forming a spacer element;
    forming a spherical adhesive element for adhering the bonding part to the substrate, the adhesive element having said spacer element embedded therein, said adhesive element having a wall and said spacer element having a wall, said spacer element being positioned within said adhesive element such that said wall of said adhesive element and said wall of said spacer element are associated with one another at a single contact region;
    positioning said formed adhesive element on each of said formed adhesive element receiving detents of said matrix plate;
    warming a bonding part;
    positioning said warmed bonding part over said formed adhesive element;
    manipulating one or the other of said formed adhesive element and said bonding part so that said formed adhesive element is attached directly to said bonding part by picking and moving said formed adhesive element onto said bonding part, whereby movement of said bonding part toward a substrate is limited by said spacer element.

2. The method for attaching a formed adhesive element to a bonding part of claim 1 wherein said formed adhesive element is composed of one or more materials selected from the group consisting of a polyurethane and an epoxy.

3. A method for attaching a formed adhesive element to a bonding part that may be adhered to a substrate comprising the steps of:
    forming a matrix plate having an upper surface and a formed adhesive element locating area formed on said upper surface;
    forming a spacer element having a wall;
    forming a spherical adhesive element for adhering the bonding part to the substrate, the adhesive element having said spacer element embedded therein, said adhesive element having a wall, said wall of said spacer element and said wall of said adhesive element being associated with one another at a single contact region;
    positioning said formed adhesive element on said formed adhesive element locating area of said matrix plate;
    warming a bonding part;
    positioning said warmed bonding part over said formed adhesive element;
    manipulating one or the other of said formed adhesive element and said bonding part so that said formed adhesive element is attached directly to said bonding part by picking and moving said formed adhesive element onto the bonding part, whereby movement of said bonding part toward a substrate is limited by said spacer element.

4. The method for attaching a formed adhesive element to a bonding part of claim 3 wherein said formed adhesive element locating area is a detent formed in said upper surface of said matrix plate.

5. The method for attaching a formed adhesive element to a bonding part of claim 3 wherein said bonding part has a shape, said shape being flat.

6. The method for attaching a formed adhesive element to a bonding part of claim 3 wherein the formed adhesive element may include multiple formed adhesive elements selected from the group consisting of like materials or different materials.

7. The method for attaching a formed adhesive element to a bonding part of claim 3 wherein said formed adhesive element includes an embedded spacer element.

8. The method for attaching a formed adhesive element to a bonding part of claim 3 wherein said formed adhesive element is composed of one or more materials selected from the group consisting of a polyurethane and an epoxy.

9. The method for attaching a formed adhesive element to a bonding part of claim 3 wherein said bonding part is composed of one or more materials selected from the group consisting of metal, glass, ceramic, plastic, and wood.

10. The method for attaching a formed adhesive element to a bonding part of claim 3 wherein said formed adhesive has a shape, said shape being selected from the group consisting of a sphere, a disc, a wafer, a ring, or an irregular shape.

11. The method of attaching a formed adhesive element to a bonding part of claim 3 wherein said formed adhesive element may include multiple formed adhesive elements of different materials, said formed adhesive elements of different materials being color coded to indicate its type of material.

* * * * *